US005218230A

United States Patent [19]
Tamamura et al.

[11] Patent Number: 5,218,230
[45] Date of Patent: Jun. 8, 1993

[54] IC PACKAGE WITH ELECTRIC CONDUCTOR LINES IN DIELECTRIC PACKAGE BODY

[75] Inventors: Masaya Tamamura, Inagi; Yoshiro Morino, Tsukuba, both of Japan

[73] Assignee: Fujitsu Limited, Kawasaki, Japan

[21] Appl. No.: 751,094

[22] Filed: Aug. 28, 1991

[30] Foreign Application Priority Data

Sep. 28, 1990 [JP] Japan .................................. 2-259364

[51] Int. Cl.[5] .......................................... H01L 23/14
[52] U.S. Cl. .................................. 257/691; 257/700
[58] Field of Search ............................... 357/80, 74

[56] References Cited

U.S. PATENT DOCUMENTS

| | | | |
|---|---|---|---|
| 4,881,116 | 11/1989 | Hidada et al. | 357/80 |
| 4,890,155 | 12/1989 | Miyagawa et al. | 357/74 |
| 4,922,324 | 5/1990 | Sudo et al. | 357/74 |

FOREIGN PATENT DOCUMENTS 61-239650 10/1986 Japan .
63-216366 9/1988 Japan .
1-202853 8/1989 Japan .
2-291140 11/1990 Japan .

*Primary Examiner*—Rolf Hille
*Assistant Examiner*—S. V. Clark
*Attorney, Agent, or Firm*—Staas & Halsey

[57] ABSTRACT

An IC package comprising a dielectric package body for encapsulating the semiconductor chip (31) and including a bottom member (1), first and second dielectric annular members (3, 7) surrounding the semiconductor chip, and a cap member (10). A first portion of the upper surface of the first dielectric annular member (3) is covered by the second dielectric annular member and a second portion of the upper surface of the first dielectric annular member (3) is exposed, whereby a strip line (Za) is formed by the second conductor film (8), the electric conductor lines (5 and 6), and a first covered portion of the first conductor film (4), and a microstrip line (Zb) is formed by the electric conductor lines (5 and 6), and a second exposed portion of the first conductor film (4). A third conductor film (9a and 9b) to be grounded is provided in the first dielectric annular member (3) in correspondence with second exposed portion of the first dielectric annular member (3), which is closer to the conductor lines (5 and 6) than the first conductor film (4) and constituting, with the conductor lines, a further microstrip line (Zb).

7 Claims, 8 Drawing Sheets

IC PACKAGE WITH ELECTRIC CONDUCTOR LINES IN DIELECTRIC PACKAGE BODY

BACKGROUND OF THE INVENTION

1. Field of the Invention

The present invention relates to an IC package, and more particularly, it relates to an IC package having electric conductor lines which transmit high speed signals from an exterior device to an interior integrated circuit.

2. Description of the Related Art

A semiconductor chip having an integrated circuit capable of treating high speed signals, such as signals of several giga bits per second (Gb/s), is hermetically encapsulated in a package body. FIG. 13 to 15 of the attached drawings show a typical conventional IC package 71.

The IC package 71 comprises a semiconductor chip 72 and a dielectric package body for encapsulating the semiconductor chip 72. The package body comprises a bottom member 73 for supporting the semiconductor chip 72 at the central region of the bottom member 73, dielectric annular members 74a and 74b surrounding the chip supporting region, and a cap member 75 covering the dielectric annular members 74a and 74b and the chip supporting region. Electric conductor lines 76 formed on the surface of the dielectric annular member 74a are obtained by patterning a conductor film, for transmitting high speed signals between an exterior device and the interior integrated circuit and for supplying power to the interior integrated circuit. The semiconductor chip 72 is provided with electrode pads which are connected to the respective one ends of the electric conductor lines 76 by bonding wires 79; the respective other ends of the electric conductor lines 76 being connected to outer leads 77.

The electric conductor lines 76 for a transmission of signals and a supply of power are formed between the dielectric annular members 74a and 74b, i.e., on the surface of the dielectric annular member 74a, and further, the conductor lines 76 are arranged between a conductor film 78a to be grounded and formed on the lower surface of the dielectric annular member 74a and a conductor film 78b to be grounded and formed on the upper surface of the dielectric annular member 74b, to thus provide transmission lines having a predetermined characteristic impedance.

In the above-described arrangement, it is necessary to expose the end portions of the conductor lines 76 at the upper dielectric annular member 74b, to allow these end portions to be connected to the leads 77 and the bonding wires 79, and accordingly, the width of the lower dielectric annular member 74a is made larger than the width of the lower dielectric annular member 74b located intermediately on the lower dielectric annular member 74a. The central portion of the upper surface of the lower dielectric annular member 74a, indicated by the character X in FIG. 15, is covered by the upper dielectric annular member 74b; the inner and the outer portions, indicated by the character Y, are exposed to the air.

Accordingly, the waveguide of the conductor lines 76 is constituted by a strip line at the central portion X, and a microstrip line at the inner and outer portions Y, resulting in a problem that the magnitude of the characteristic impedance is not uniform and a reflection loss occurs due to an impedance mismatching.

Further, one of the conductor lines 76 is a power supply line through which a direct current is supplied, however, the level of the current changes depending on the operation of the components in the integrated circuit and current through the power supply conductor line 76 includes components of an alternating current, and thus the voltage of the current passing through the power supply conductor line 76 is affected by the characteristic impedance. The variation of the power voltage varies largely due to the characteristic impedance which becomes larger at the microstrip line, and a problem arises in that the operation of the integrated circuit is unstable.

To solve these problems, Japanese Unexamined Patent Publication (Kokai) No. 61-239650 discloses an IC package in which portions of the conductor lines in correspondence with the area of the microstrip line are broadened to effect an impedance matching. This arrangement, however, causes a lowering of the degree of integration and an increase in the length of the dielectric annular members 74a and 74b, which is increased with the number of the conductor lines 76, it becomes difficult to design an IC package having a small size.

SUMMARY OF THE INVENTION

The object of the present invention is to solve these problems and to provide an IC package in which a characteristic impedance of conductor lines can be matched, without a change of a size of the package.

The another object of the present invention is to provide an IC package in which a characteristic impedance of a power supply conductor line can be lowered.

According to the present invention, there is provided an IC package comprising a semiconductor chip, a dielectric package body for encapsulating the semiconductor chip and comprising a bottom member, a first dielectric annular member arranged on the bottom member and surrounding the semiconductor chip, a second dielectric annular member arranged on the first dielectric annular member, and a cap member attached to the second dielectric annular member, the first and second dielectric annular members having upper and lower surfaces, inner and outer edges, and widths between the inner and outer edges, respectively, the width of the first dielectric annular member being larger than the width of the second dielectric annular member so that a first portion of the upper surface of the first dielectric annular member is covered by the second dielectric annular member and a second portion of the upper surface of the first dielectric annular member is exposed, electric conductor lines formed on the upper surface of the first dielectric annular member and substantially extending between the inner and outer edges of the first dielectric annular member, a first conductor film to be grounded and formed on the lower surface of the first dielectric annular member, and a second conductor film to be grounded and formed on the upper surface of the second dielectric annular member, so that a strip line is formed by the second conductor film, the electric conductor lines, and a first portion of the first conductor film in correspondence with the first covered portion of the first dielectric annular member, and a microstrip line is formed by the electric conductor lines and a second portion of the first conductor film in correspondence with the second exposed portion of the first dielectric annular member, and wherein a third conductor film to be grounded is provided in the first dielectric annular member in correspondence with at least a part of the second exposed portion of the first dielectric annular member, the third conductor film being closer to the conductor lines than the first conductor film and constituting, with the conductor lines, a further microstrip line. The first dielectric annular member may comprise subdivided members having surfaces overlapping each other, and the third conductor film can be formed on one of the overlapped surfaces.

In this arrangement, the third conductor film is provided in addition to and closer to the conductor lines than the first conductor film. The third conductor film constitutes, with the conductor lines, a further microstrip line, in addition to the initial microstrip line constituted by the electric conductor lines and a second exposed portion of the first conductor film. The characteristic impedance of the further microstrip line can be smaller than that of the initial microstrip line, since the third conductor film is closer to the conductor lines and the thickness of dielectric material between the third conductor film and the conductor lines becomes thinner, and thus the characteristic impedance of the further microstrip line can be made identical to the characteristic impedance of the strip line constituted by the second conductor film, the electric conductor lines, and the first covered portion of the first conductor film. Accordingly, the characteristic impedance is made the same for all of the conductor lines, and thus the transmission is greatly improved.

Preferably, the electric conductor lines includes signal transmission lines and at least one power supply line, and a fourth narrow conductor film to be grounded is provided in the first dielectric annular member in correspondence with the at least one power supply line, and connected to the third conductor film. In this arrangement, the fourth narrow conductor film is closer to the power supply conductor line than the first conductor film and provides a low characteristic impedance. Also, preferably a fifth narrow conductor film to be grounded is provided in the second dielectric annular member in correspondence with the at least one power supply line, in addition to the fourth narrow conductor film.

BRIEF DESCRIPTION OF THE DRAWINGS

The present invention will become more apparent from the following description of the preferred embodiments, with reference to the accompanying drawings, in which.

DESCRIPTION OF THE PREFERRED EMBODIMENTS

Figure 1:
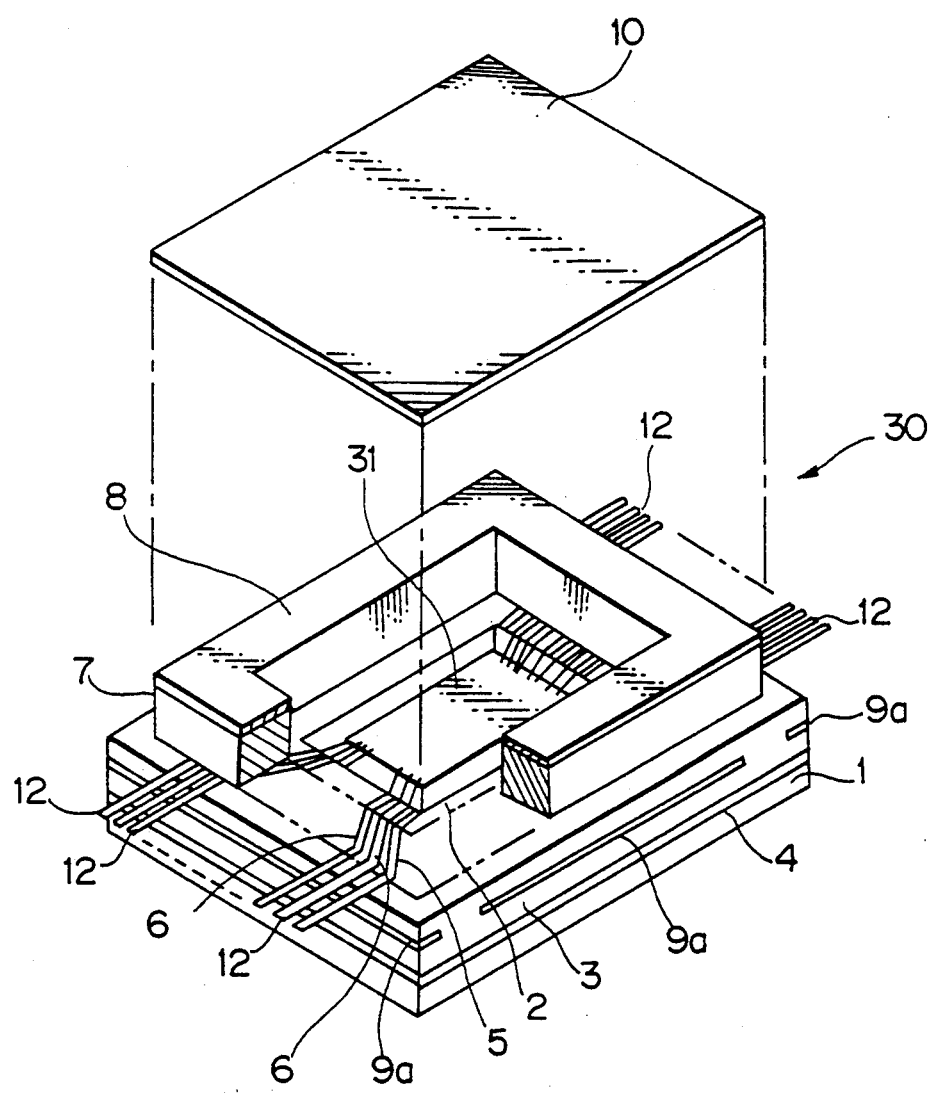
FIG. 1 is a perspective view of an IC package according to the first embodiment of the present invention, with a cap member removed.

FIGS. 1 to 4 show the IC package 30 according to the first embodiment of the present invention. The IC package 30 comprises a semiconductor chip 31 and a dielectric package body for encapsulating the semiconductor chip 31. The package body comprises a bottom member 1 having a chip holder 2 at the central region thereof, for supporting the semiconductor chip 31, a first dielectric annular member 3 arranged on the bottom member 1 and surrounding the chip holder 2, a second dielectric annular member 7 arranged on the first dielectric annular member 3, and a cap member 10 covering the dielectric annular members 3 and 7. The bottom member 1, and the dielectric annular members 3 and 7, can be made from, for example, an insulating ceramic material such as alumina, and have flat and parallel upper and lower surfaces, respectively, to allow one to be rested on the other. The dielectric annular members 3 and 7 have inner and outer peripheral edges and widths between the inner and outer edges, respectively.

Electric conductor lines 5 and 6 are formed on the upper surface of the first dielectric annular member 3 and are obtained by patterning a conductor film of, for example, gold into lines. The electric conductor lines 5 and 6 extend between an inner edge and an outer edge of the first dielectric annular member 3, as clearly shown in FIG. 4. One of the electric conductor lines 5 supplies power to the interior integrated circuit, one of the electric conductor lines 6 may be connected to the ground, and the other of the electric conductor lines 6 transmits signals between an exterior device and the interior integrated circuit.

Figure 2:
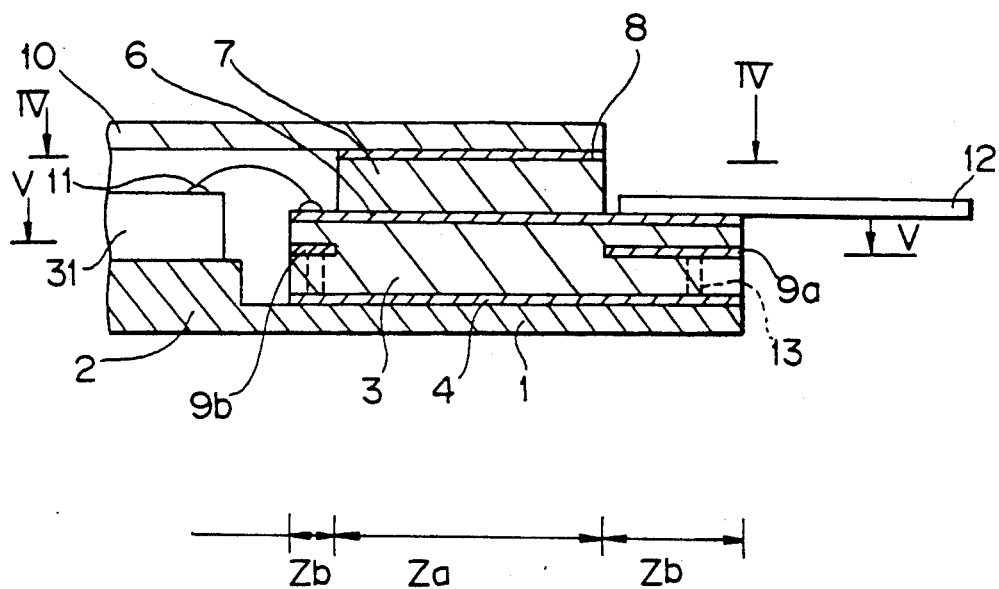
FIG. 2 is a cross-sectional view of the IC package of FIG. 1 along the line II—II in FIG. 4.
Figure 4:
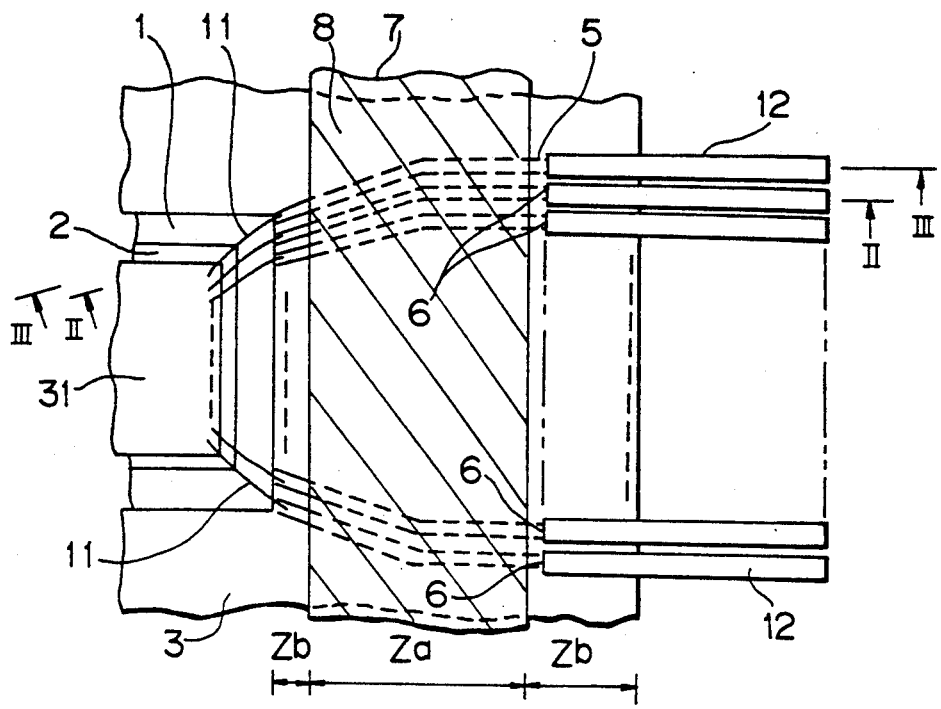
FIG. 4 is a cross-sectional view of the IC package of FIG. 1, taken along the line IV—IV in FIG. 2.

A first conductor film 4 to be grounded is formed on the lower surface of the first dielectric annular member 3, and a second conductor film 8 to be grounded is formed on the upper surface of the second dielectric annular member 7. The width of the first dielectric annular member 3 is larger than the width of the second dielectric annular member 8, at least in the region of the electric conductor lines 5 and 6, so that a first portion of the upper surface of the first dielectric annular member 3 is covered by the second dielectric annular member 7 and a second portion of the upper surface of the first dielectric annular member 3 is exposed. As shown in FIGS. 2 and 4, the covered portion of the first dielectric annular member 3 is located intermediately between the inner and outer edges thereof, and the second exposed portion comprises an inner portion on the inner side of the first covered portion and an outer portion on the outer side of the first covered portion. The central covered portion is designated by the character Za, and the inner and outer exposed portions are designated by the characters Zb.

Accordingly, a strip line Za is formed by the second conductor film 8, the electric conductor lines 5 and 6, and a first central portion of the first conductor film 4 in correspondence with the first covered portion of the first dielectric annular member 3. Also, microstrip lines Zb are formed by the electric conductor lines 5 and 6, and a second portion of the first conductor film 4 in correspondence with the second exposed portion of the first dielectric annular member 3.

A third conductor film to be grounded is provided in correspondence with the second exposed portion of the first dielectric annular member 3. In FIG. 2, the third conductor film includes an outer film portion 9a on the outer side of the first covered portion covered by the second dielectric annular member 7 and an inner film portion 9b on the inner side of the first covered portion.

The third conductor film 9a, 9b is provided in the first dielectric annular member 3 in a plane in parallel to the conductor lines 5 and 6, so that the third conductor film 9a, 9b is closer to the conductor lines 5 and 6 than the first conductor film 4 and constitutes, with the conductor lines 5 and 6, a further microstrip line in place of the initial microstrip line, as described above with reference to the character Zb. The characteristic impedance of the further microstrip line (also referred to Zb) can be smaller than that of the initial microstrip line, since the third conductor film 9a, 9b is closer to the conductor lines 5 and 6 and the thickness of dielectric material between the third conductor film 9a, 9b and the conductor lines 5 and 6 becomes thinner. Accordingly, the characteristic impedance of the further microstrip line can be made identical to the characteristic impedance of the strip line Za, by appropriately selecting the distance between the third conductor film 9a, 9b and the conductor lines 5 and 6, so that the characteristic impedance is made the same for all of the conductor lines 5 and 6, and thus the characteristic is greatly improved.

The semiconductor chip 31 is provided with electrode pads connected to the respective one ends of the electric conductor lines 5 and 6 by bonding wires 11, and the respective other ends of the electric conductor lines 5 and 6 are connected to outer leads 12. Also, through holes 13 are provided at positions where the conductor lines 5 and 6 do not exist, for connecting the conductor films 4, 8, and 9a, 9b to the ground line. Note, the conductors are formed from, for example, gold or aluminum.

Figure 6:
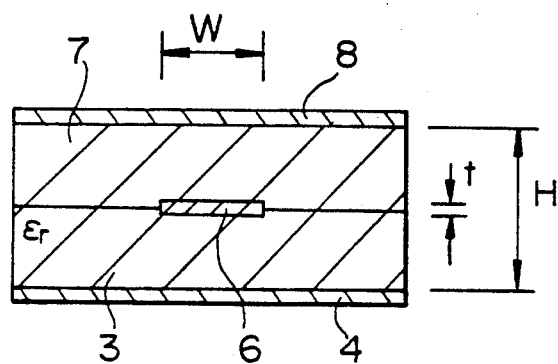
FIG. 6 is a view illustrating a strip line.
Figure 7:
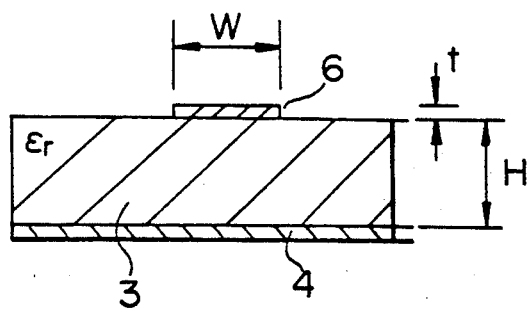
FIG. 7 is a view illustrating a microstrip line.

FIGS. 6 and 7 diagrammatically show the principles of the strip line Za and the microstrip line Zb, respectively. The characteristic impedance Zs of the strip line Za and the characteristic impedance Zm of the microstrip line Zb can be calculated according to the following relationship, by using the width W and the thickness t of the electric conductor lines 5 and 6, the dielectric constant $\epsilon r$ of the first and second dielectric annular members 3 and 7, and the thickness H of the dielectric material between the first and second conductor films 4 and 8 (FIG. 6), or between the first conductor film 4 and the electric conductor lines 5 and 6 (FIG. 7).

The characteristic impedance Zs of the strip line Za is, under the condition ($W \ll H$, $t/H < 0.25$, $W/(H-t) < 0.35$):

$$Zs = \frac{60}{\epsilon r} \ln\left(\frac{4H}{\pi d}\right)$$

where $d$ = 0.5 $W + t$    (at $0 \leq t/W \leq 0.1$)

= 0.67 $W(0.8 + t/W)$   (at $0.1 < t/W$)

The characteristic impedance Zm of the microstrip line Zb is, under the condition ($W_0/H \leq 1$):

$$Zm = \frac{60}{\epsilon eff} \ln\left(\frac{8H}{W_0} + \frac{W_0}{4H}\right)$$

and under the condition ($W_0/H > 1$):

$$Zm = \frac{120\pi}{\epsilon eff\{W_0/H + 2.42 - 0.44 \times H/W_0 + (1 - H/W_0)^6\}}$$

where $\epsilon eff = (\epsilon r + 1)/2 + \{(\epsilon r - 1)/2\} \cdot \{1/1 + 10H/W_0\}$ $W_0 = W + \Delta W$ $\Delta W = t/\pi \ln(1 + 4\pi W/t)$ (at $\frac{1}{2}\pi > W/H > 2t/H$)

$W = t/\pi \ln(1 + 2H/t)$ (at $W/H > \frac{1}{2}\pi > 2t/H$)

The following examples are the results of calculations made to obtain the same value 50Ω of the characteristic impedance Zs of the strip line Za, where the width W (mm), the thickness t (mm), and the thickness H (mm) are changed and the dielectric constant $\epsilon r$ is 10.
When W=0.15
t=0.003 0.005 0.010 0.015 0.020 0.025
H=0.854 0.876 0.931 0.986 1.027 1.064
When W=0.20
t=0.003 0.005 0.010 0.015 0.020 0.025
H=1.128 1.150 1.205 1.260 1.314 1.358
When W=0.25
t=0.003 0.005 0.010 0.015 0.020 0.025
H=1.402 1.424 1.479 1.534 1.588 1.643
When W=0.30
t=0.003 0.005 0.010 0.015 0.020 0.025
H=1.676 1.698 1.753 1.807 1.862 1.917
When W=0.40
t=0.003 0.005 0.010 0.015 0.020 0.025
H=2.224 2.245 2.300 2.355 2.410 2.465
When W=0.50
t=0.003 0.005 0.010 0.015 0.020 0.025
H=2.771 2.793 2.848 2.903 2.957 3.012

Also, the following examples are the results of calculations made to obtain the identical value 50Ω of the characteristic impedance Zm of the further microstrip line Zb.
When W=0.15
t=0.003 0.005 0.010 0.015 0.020 0.025
H=0.166 0.168 0.173
When W=0.20
t=0.003 0.005 0.010 0.015 0.020 0.025
H=0.219 0.222 0.227 0.232
When W=0.25
t=0.003 0.005 0.010 0.015 0.020 0.025
H=0.273 0.276 0.282 0.287 0.291
When W=0.30
t=0.003 0.005 0.010 0.015 0.020 0.025

H=0.327 0.330 0.336 0.341 0.346 0.350

Accordingly, it is possible to match the characteristic impedance of the conductor lines 5 and 6, especially the signal lines 6, and to prevent a reflection of high frequency signals in the conductor lines 5 and 6 even when high frequency signals of several G b/s are transmitted and received.

If the further microstrip line is not provided, the characteristic impedance Zm of the initial microstrip line Zb formed between the conductor lines 5 and 6 and the first conductor film 4 has the value 74Ω, where W= 0.30, t=0.005, and H=0.85.

Figure 3:
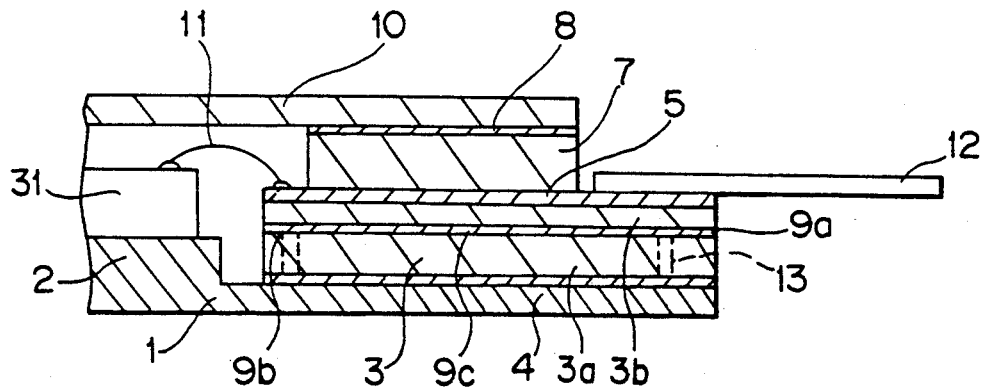
FIG. 3 is a cross-sectional view of the IC package of FIG. 1, taken along the line III—III in FIG. 4.
Figure 5:
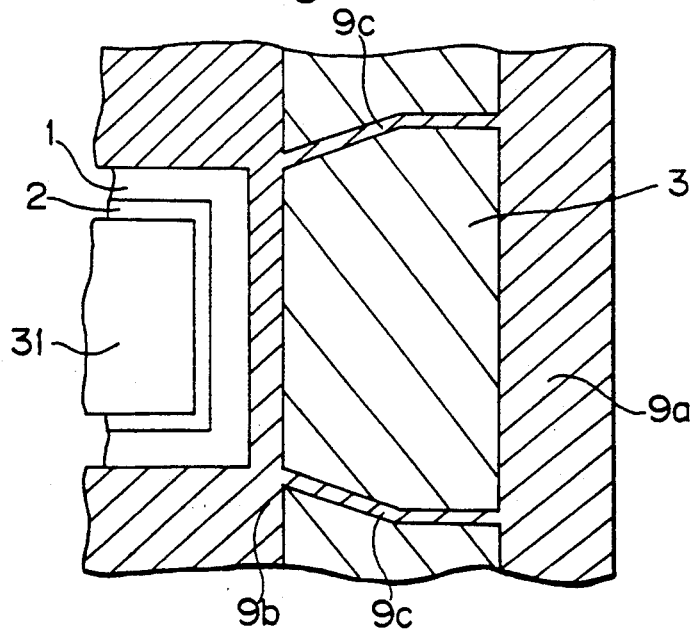
FIG. 5 is a cross-sectional view of the IC package of FIG. 1, taken along the line V—V in FIG. 2.

Referring now to FIGS. 3 and 5, a fourth narrow conductor film 9c to be grounded is provided in the first dielectric annular member 3 in correspondence with the power supply line 5, and connected to the third conductor film 9a, 9b. The fourth narrow conductor film 9c is also provided for the ground line, and is closer to the power supply line 5 than the first conductor film 4 and constitutes, with the second conductor film 8 and the power supply line 5, a further strip line in place of the initial strip line. The characteristic impedance of this further strip line is lower than that of the initial strip line. It is possible to lower the characteristic impedance for the power supply line 5, for example, to 43Ω, by the provision of this further strip line in comparison with the characteristic impedance of 50Ω of the initial microstrip line, and thus the voltage of the current passing through the power supply conductor line 5 is less affected by the characteristic impedance even if the high frequency signals are used, and the variation of the power voltage is small enough to ensure that the operation of the integrated circuit is stable.

The following examples are obtained for the fourth narrow conductor film 9c for the power supply line 5, where the width W and the thickness t=0.005 mm, the dielectric constant $\epsilon r=10$, the thickness H=0.85, and the distance between the fourth conductor film 9c and the power line 5:

When the third conductor film 9a, 9b and the fourth narrow conductor film 9c are not provided
W 32 0.30
Zs=50Ω
Zm=74Ω

When the conductor film 9a, 9b and the fourth narrow conductor film 9c are provided
W=0.30
Zs=43Ω
Zm=50Ω
W=0.60
Zs=32Ω
Zm=34Ω

The third conductor film 9a, 9b and the fourth narrow conductor film 9c are provided in the first dielectric annular member 3 in a plane in parallel to the conductor lines 5 and 6. In the actual formation of the third conductor film 9a, 9b and the fourth narrow conductor film 9c, these are not filled in cavities of the first dielectric annular member 3 but must be deposited on a surface of a dielectric member. In this regard, the first dielectric annular member 3 comprises subdivided members 3a and 3b divided at a plane of the third conductor film 9a, 9b and the fourth narrow conductor film 9c in FIG. 3. The subdivided members have surfaces overlapping each other, to complete the first dielectric annular member 3, and the third conductor film 9a, 9b and the fourth narrow conductor film 9c are formed on one of the overlapping surfaces.

Figure 8:
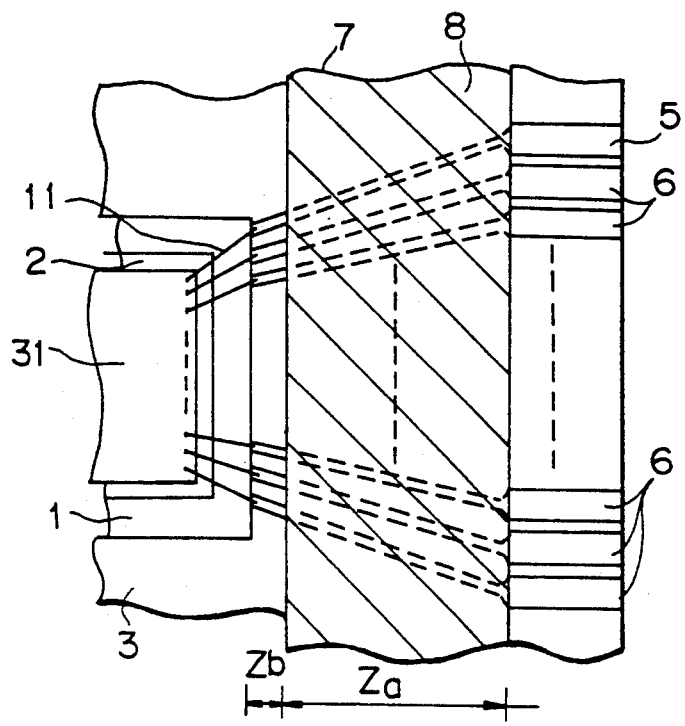
FIG. 8 is a cross-sectional view of an IC package according to the second embodiment of the present invention.
Figure 9:
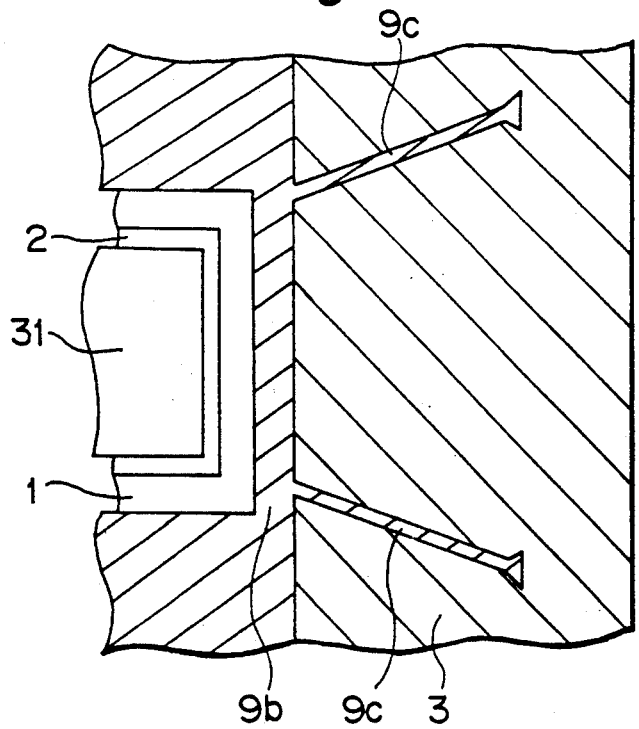
FIG. 9 is another cross-sectional view FIG. 8.

FIGS. 8 and 9 show the second preferred embodiment of the present invention. This embodiment also comprises a package body including a bottom member 1, a first dielectric annular member 3, a second dielectric annular member 7, and a cap member 10, but some of these members are not shown in FIGS. 8 and 9. Also, electric conductor lines 5 and 6 are formed on the upper surface of the first dielectric annular member 3, a first conductor film 4 to be grounded is formed on the lower surface of the first dielectric annular member 3, and a second conductor film 8 to be grounded is formed on the upper surface of the second dielectric annular member 7.

Also, a third conductor film to be grounded is provided in the first dielectric annular member 3 in correspondence with at least a part of the second exposed portion of the first dielectric annular member 3. This embodiment shows that the third conductor film is provided in correspondence with one of the inner portion and the outer portion of the second exposed portion of the first dielectric annular member 3. In particular, the third conductor film 9b is provided in the first dielectric annular member 3 in correspondence with the inner exposed portion on the inner side of the central covered portion. Therefore, the further microstrip line Zb is formed only on the inner side of the strip line Za. Nevertheless, the width of each of the electric conductor lines 5 and 6 is enlarged at a region on the outer side of the strip line Za to compensate for a lowering of the characteristic impedance due to a microstrip line.

Figure 10:
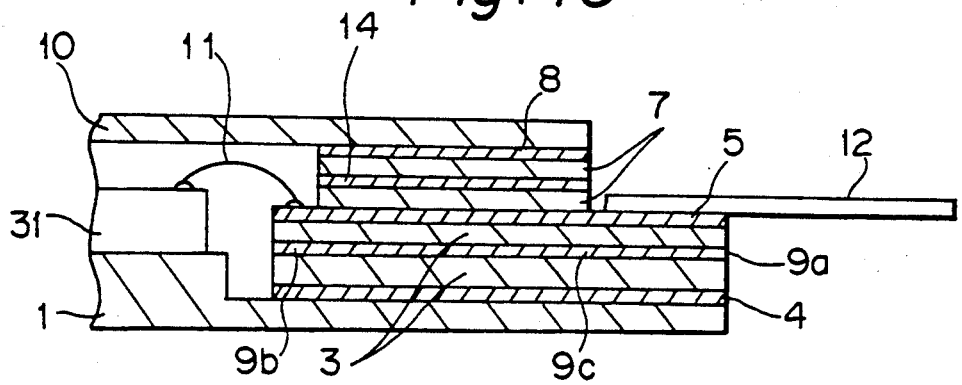
FIG. 10 is a cross-sectional view of an IC package according to the third embodiment of the present invention.

FIG. 10 shows the third preferred embodiment of the present invention. This embodiment comprises a package body similar to the first embodiment, and further, comprises a fifth narrow conductor film 14 to be grounded. The fifth narrow conductor film 14 is formed in the second dielectric annular member 7 in correspondence with the power supply line 5, in addition to the fourth narrow conductor film 9c, and in parallel to the power supply line 5. Therefore, a further strip line is formed by the fifth narrow conductor film 14, the power supply line 5, and the fourth narrow conductor film 9c, and this further strip line provides an even lower impedance to the supply line 5. The characteristic impedance of this further strip line is 36Ω when the distances between the fourth conductor film 9c and the power line 5, and between the fifth conductor film 14 and the power line 5, are 0.33 mm, respectively.

Figure 11:
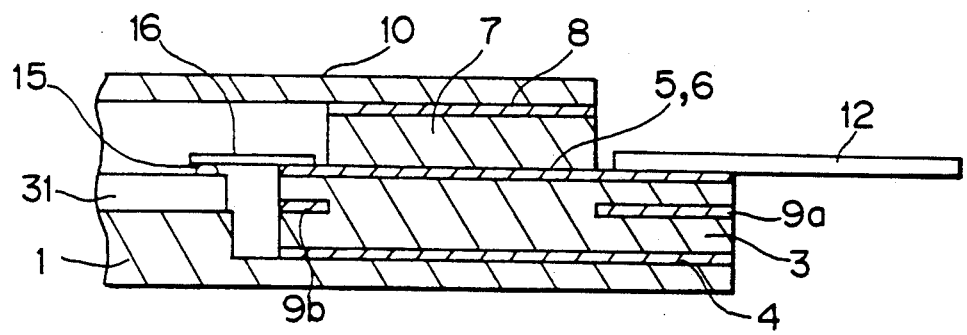
FIG. 11 is a cross-sectional view of an IC package according to the fourth embodiment of the present invention.

FIG. 11 shows the fourth preferred embodiment of the present invention. This embodiment comprises a package body similar to the first embodiment, but although the first embodiment employs bonding wires 11 to connect the semiconductor chip 31 to the one ends of the conductor lines 5 and 6, in the embodiment of FIG. 11, the semiconductor chip 31 is provided with a plurality of solder bumps 15 (only one shown in FIG. 11) to which terminals 16 of a TAB (tape automated bonding) sheet are connected to the conductor lines 5 and 6 by soldering or eutectic.

Figure 12:
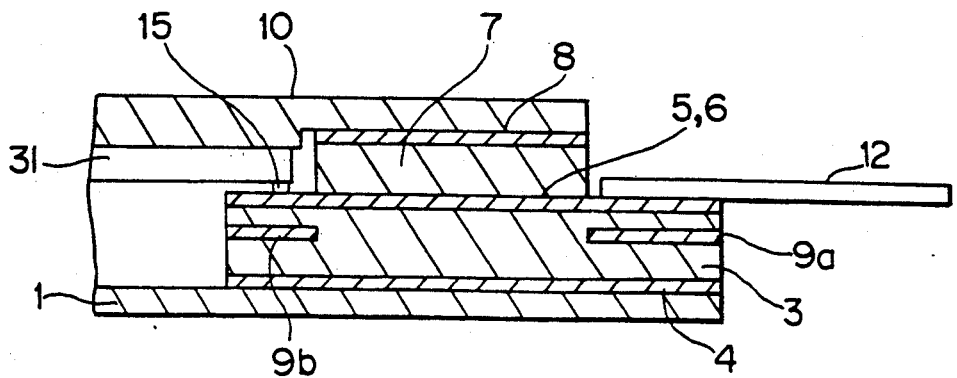
FIG. 12 is a cross-sectional view of an IC package according to the fifth embodiment of the present invention.
Figure 13:
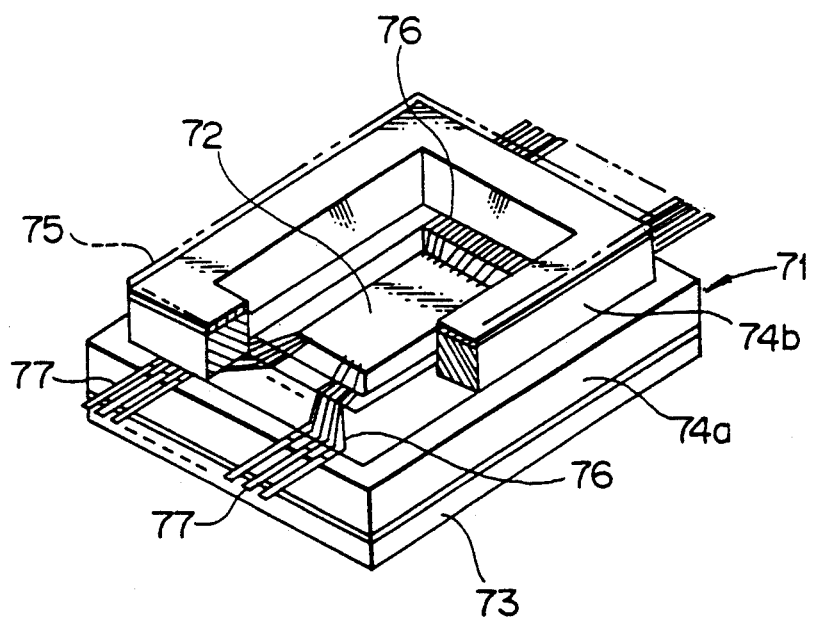
FIG. 13 is a perspective view of a conventional IC.
Figure 14:
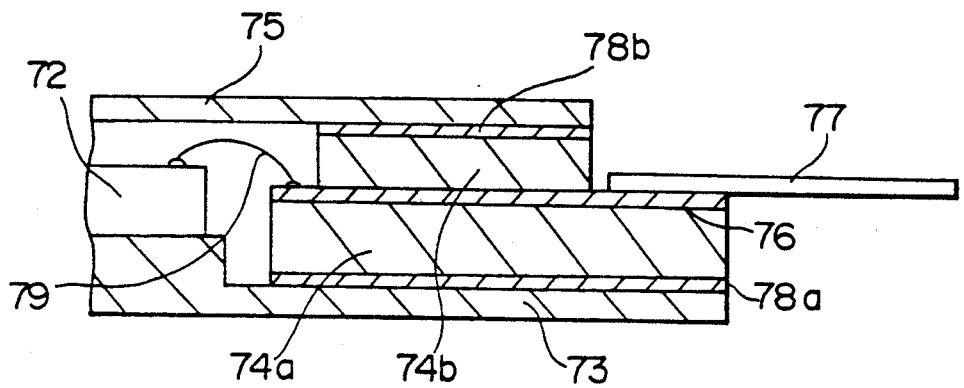
FIG. 14 is a cross-sectional view of the IC package of FIG. 13.
Figure 15:
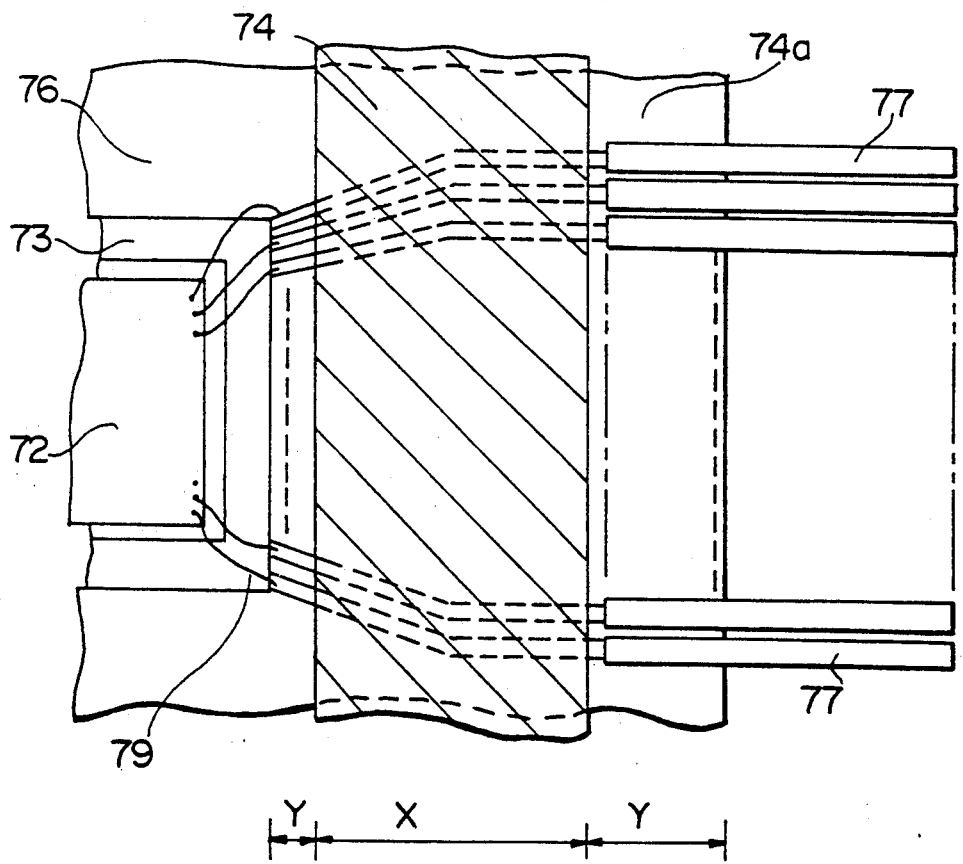
FIG. 15 is a further cross-sectional view of the IC package of FIG. 13.

FIG. 12 shows the fifth preferred embodiment of the present invention. This embodiment employs an arrangement in which the semiconductor chip 31 is supported at the cap member 10 and the semiconductor chip 31 is provided with a plurality of solder bumps 15 (only one shown in FIG. 11) which are connected to the conductor lines 5 and 6 by a flip chip method.

As explained, an IC package according to the present invention is characterized in that a third conductor film to be grounded is provided in the first dielectric annular member in correspondence with at least a part of the second exposed portion of the first dielectric annular member, the third conductor film being closer to the conductor lines than the first conductor film and constituting, with the conductor lines, a further microstrip line. Accordingly, the characteristic impedance of the further microstrip line can be smaller than that of the initial microstrip line, and thus the characteristic impedance of the further microstrip line can be made identical to the characteristic impedance of the strip line, and accordingly, the transmission is greatly improved.

Also, a fourth narrow conductor film to be grounded is provided in the first dielectric annular member in correspondence with the at least one power supply line, and connected to the third conductor film, to provide a lower characteristic impedance to the power supply line.

We claim:

1. An IC package comprising:
   a semiconductor chip;
   a package body for encapsulating the semiconductor chip and comprising a bottom member, a first dielectric annular member arranged on the bottom member and surrounding the semiconductor chip, a second dielectric annular member arranged on the first dielectric annular member, and a cap member attached to the second dielectric annular member, the first and the second dielectric annular members having upper and lower surfaces, inner and outer edges, and widths between the inner and outer edges, respectively;
   the width of the first dielectric annular member being larger than the width of the second dielectric annular member so that a first portion of the upper surface of the first dielectric annular member is covered by the second dielectric annular member and a second portion of the upper surface of the first dielectric annular member is exposed;
   electric conductor lines formed on the upper surface of the first dielectric annular member to substantially extend between the inner and outer edges of the first dielectric annular member;
   a first conductor film to be grounded and formed on the lower surface of the first dielectric annular member, and a second conductor film to be grounded and formed on the upper surface of the second dielectric annular member, so that a strip line is formed by the second conductor film, a first portion of the electric conductor lines and the first conductor film in correspondence with the first covered portion of the first dielectric annular member, and a microstrip line is formed by a second portion of the electric conductor lines and the first conductor film in correspondence with the second exposed portion of the first dielectric annular member; and
   a third conductor film to be grounded which is provided in the first dielectric annular member in correspondence with at least a part of the second exposed portion of the first dielectric annular member, the third conductor film being closer to the conductor lines than the first conductor film and constituting, with the second portion of the electric conductor lines in correspondence with the second exposed portion of the first dielectric annular member, a further microstrip line,
   the electric conductor lines including signal transmission lines and at least one power supply line, and
   a fourth narrow conductor film to be grounded being provided in the first dielectric annular member in correspondence with the at least one power supply line and connected to the third conductor film.

2. An IC package according to claim 1, wherein the first dielectric annular member comprises subdivided members having surfaces overlapping each other, and the third conductor film is formed on one of the overlapping surfaces.

3. An IC package according to claim 1, wherein the first covered portion of the first dielectric annular member is located intermediately between the inner and outer edges thereof and the second exposed portion comprises an inner portion on the inner side of the first covered portion and an outer portion on the outer side of the first covered portion.

4. An IC package according to claim 3, wherein the third conductor film is provided in correspondence with the inner portion and the outer portion of the second exposed portion of the first dielectric annular member.

5. An IC package according to claim 3, wherein the third conductor film is provided in correspondence with one of the inner portion and the outer portion of the second exposed portion of the first dielectric annular member.

6. An IC package according to claim 5, wherein a fifth narrow conductor film to be grounded is provided in the second dielectric annular member in correspondence with the at least one power supply line in addition to the fourth narrow conductor film.

7. An IC package according to claim 1, wherein the first dielectric annular member has a thickness equal to a thickness of the second dielectric annular member so that the first conductor film and the second conductor film are equidistant from the electric conductor lines.

* * * * *

UNITED STATES PATENT AND TRADEMARK OFFICE
CERTIFICATE OF CORRECTION

PATENT NO. : 5,218,230
DATED : June 8, 1993
INVENTOR(S) : Masaya Tamamura et al.

It is certified that error appears in the above-indentified patent and that said Letters Patent is hereby corrected as shown below:

Column 6, line 29, at the beginning of the equation insert --Δ--.

Column 7, line 42, change "32" to --=-- (equal sign).

Column 7, line 45, after "the" (first occurrence) insert --third--.

Signed and Sealed this

Twenty-ninth Day of March, 1994

Attest:

BRUCE LEHMAN

Attesting Officer     Commissioner of Patents and Trademarks